(12) United States Patent
Park et al.

(10) Patent No.: US 8,755,019 B2
(45) Date of Patent: Jun. 17, 2014

(54) METHOD FOR MANUFACTURING A LIQUID CRYSTAL DISPLAY

(75) Inventors: Ji-Young Park, Hwaseong-si (KR); Sang Gab Kim, Seoul (KR); Yong-Mo Choi, Suwon-si (KR); Hyung Jun Kim, Yongin-si (KR); Sung-Haeng Cho, Chungcheongbuk-do (KR); Hong-Sick Park, Suwon-si (KR); Byeong-Jin Lee, Yongin-si (KR); Soo-Wan Yoon, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 243 days.

(21) Appl. No.: 13/193,488

(22) Filed: Jul. 28, 2011

(65) Prior Publication Data

US 2012/0133873 A1 May 31, 2012

(30) Foreign Application Priority Data

Nov. 29, 2010 (KR) ........................ 10-2010-0119741

(51) Int. Cl.
*G02F 1/1339* (2006.01)
*G02F 1/13* (2006.01)

(52) U.S. Cl.
USPC .......................................... 349/155; 349/187

(58) Field of Classification Search
USPC .......................................... 349/155–157, 187
See application file for complete search history.

(56) References Cited

U.S. PATENT DOCUMENTS

| 7,119,368 | B2 | 10/2006 | Park et al. | |
| 7,279,371 | B2 | 10/2007 | Kim | |
| 7,459,323 | B2 | 12/2008 | Park et al. | |
| 2005/0158925 | A1* | 7/2005 | Kim | 438/151 |
| 2007/0132903 | A1* | 6/2007 | Lim | 349/43 |
| 2007/0164284 | A1* | 7/2007 | Park et al. | 257/59 |
| 2009/0002589 | A1* | 1/2009 | Tanada | 349/43 |
| 2009/0002619 | A1* | 1/2009 | Kanai et al. | 349/129 |

FOREIGN PATENT DOCUMENTS

| KR | 1019980072230 A | 11/1998 |
| KR | 1020010017422 A | 3/2001 |
| KR | 1020080030761 A | 4/2008 |
| KR | 1020080047166 A | 5/2008 |

* cited by examiner

*Primary Examiner* — Jessica M Merlin
(74) *Attorney, Agent, or Firm* — Innovation Counsel LLP

(57) ABSTRACT

A method of manufacturing a liquid crystal display includes: forming a gate line including a gate electrode on a first substrate; forming a gate insulating layer on the gate line; sequentially forming a semiconductor layer, an amorphous silicon layer, and a data metal layer on the entire surface of the gate insulating layer; aligning the edges of the semiconductor layer and the data metal layer; forming a transparent conductive layer on the gate insulating layer and the data metal layer; forming a first pixel electrode and a second pixel electrode by patterning the transparent conductive layer; and forming a data line including a source electrode, a drain electrode, and an ohmic contact layer by etching the data metal layer and the amorphous silicon layer, using the first pixel electrode and the second pixel electrode as a mask, and exposing the semiconductor between the source electrode and the drain electrode.

16 Claims, 15 Drawing Sheets

METHOD FOR MANUFACTURING A LIQUID CRYSTAL DISPLAY

CROSS-REFERENCE TO RELATED APPLICATION

This application claims priority to and the benefit of Korean Patent Application No. 10-2010-0119741 filed in the Korean Intellectual Property Office on Nov. 29, 2010, the entire contents of which are incorporated herein by reference.

BACKGROUND OF THE INVENTION (a) Field of the Invention

The present invention relates to a liquid crystal display and a method for manufacturing the same.

(b) Description of the Related Art

Liquid crystal displays, which are the most popular type of flat panel displays, are composed of two display panels that have electrodes and a liquid crystal layer therebetween. In a liquid crystal display the amount of light transmitted through the display is adjusted by applying voltage to the electrode such that liquid crystal molecules are rearranged.

The most common types of the liquid crystal displays have a structure in which field generating electrodes are on two display panels. In most liquid crystal displays, a plurality of thin film transistors and a pixel electrode are arranged in a matrix on one display panel (hereinafter, referred to as a 'thin film transistor array panel') while color filters including red, green, and blue are on the other display panel (hereinafter, referred to as 'common electrode panel') in which the front side is coated with a common electrode.

The thin film transistor array panel has a layered structure in which a plurality of conductive layers and insulating layers are stacked. Such a thin film transistor array panel is manufactured by forming layers and applying photolithography to them several times, and the ability to form stable elements while reducing the number of photolithography steps is important for reducing manufacturing costs.

The above information disclosed in this Background section is only for enhancement of understanding of the background of the disclosure and therefore it may contain information that does not form the prior art that is already known to a person of ordinary skill in the art.

SUMMARY OF THE INVENTION

A method of manufacturing a liquid crystal display with only a small number of photo processes is provided.

In one aspect, a method of manufacturing a liquid crystal display includes: forming a gate line including a gate electrode on a first substrate; forming a gate insulating layer on the gate line; sequentially forming a semiconductor layer, an amorphous silicon layer, and a data metal layer on the entire surface of the gate insulating layer; aligning the edges of the semiconductor layer and the data metal layer by etching the semiconductor layer, the amorphous silicon layer doped with impurities, and the data metal layer; forming a transparent conductive layer on the gate insulating layer and the data metal layer; forming a first pixel electrode and a second pixel electrode by patterning the transparent conductive layer; and forming a data line including a source electrode, a drain electrode, and an ohmic contact layer by etching the data metal layer and the amorphous silicon layer, using the first pixel electrode and the second pixel electrode as a mask, and exposing the semiconductor between the source electrode and the drain electrode, in which the first pixel electrode is in contact with the drain electrode and the second pixel electrode is in contact with the source electrode.

The method may further include applying a plasma process to the exposed semiconductor, after the exposing of the semiconductor between the source electrode and the drain electrode.

The plasma process may be performed by using a gas mixture of a hydrogen gas and a nitrogen gas, under a 250° C. condition.

The mixing ratio of the hydrogen gas and the nitrogen gas may be 1:1 or more.

The mixing ratio of the hydrogen gas and the nitrogen gas may be 1:3.

The method may further include forming a nitrified silicon film on the first pixel electrode, the second pixel electrode, and the exposed semiconductor, forming a spacer on the nitrified silicon film corresponding to the exposed semiconductor, and forming a buffer layer by etching the nitrified silicon film, using the spacer as a mask, after performing the plasma process.

The method may further include forming a passivation layer between the gate insulating layer and the data line, and between the first pixel electrode and the second pixel electrode, in which the passivation layer may expose the source electrode and the drain electrode.

The aligning of the ends of the semiconductor layer and the data metal layer may further include performing an etch back process before etching the semiconductor layer, after etching the amorphous silicon layer doped with impurities and the data metal layer.

The etching solution for etching the transparent conductive layer and the etching solution for etching the data metal layer and the amorphous silicon layer may be the same.

The data line and the drain electrode may be composed of a lower layer containing molybdenum or molybdenum-based metal, such as molybdenum nitride, molybdenum-niobium, molybdenum-vanadium, molybdenum-titanium, or molybdenum-tungsten, an intermediate layer containing aluminum or aluminum-based metal, such as aluminum-neodymium, and an upper layer containing molybdenum or molybdenum-based metal, such as molybdenum nitride, molybdenum-niobium, molybdenum-vanadium, molybdenum-titanium, or molybdenum-tungsten.

The data line and the drain electrode may be composed of a lower layer made of titanium or a titanium alloy and an upper layer made of copper or a copper alloy.

The second pixel electrode may extend above the data line, in contact with the data line.

The semiconductor layer may be an oxide semiconductor.

In another aspect, a liquid crystal display includes: a first substrate; a gate line disposed on the first substrate and including a gate electrode; a gate insulating layer disposed on the gate line; a semiconductor disposed on the gate insulating layer; a data line disposed on the semiconductor and including a source electrode, and a drain electrode opposite to the source electrode; a first pixel electrode disposed on the gate insulating layer and the drain electrode; and a second pixel electrode disposed on the source electrode, in which the first pixel electrode is in contact with the drain electrode and the second pixel electrode is in contact with the source electrode.

The liquid crystal display may further include a buffer layer disposed on the semiconductor between the source electrode and the drain electrode, and a space disposed on the buffer layer.

The liquid crystal display may further include a passivation layer disposed between the gate insulating layer and the data line and between the first pixel electrode and the second pixel electrode, and exposing the source electrode and the drain electrode.

Because the source and drain electrodes and the channel of the thin film transistor are formed by using the pixel electrode as a mask, it is possible to reduce the number of photo processes, such that the manufacturing process is simplified and the manufacturing cost can be reduced.

Further, because a contact hole for contacting the pixel electrode with the drain electrode is not formed in the pixel, it is possible to improve the aperture ratio of the pixel.

Further, because the plasma treatment is performed by using a gas mixture of the hydrogen gas $H_2$ and the nitrogen gas $N_2$ after forming the channel of the thin film transistor using the pixel electrode as a mask, it is possible to prevent haze from being generate in the pixel electrode.

DETAILED DESCRIPTION OF THE EMBODIMENTS

Figure 1:
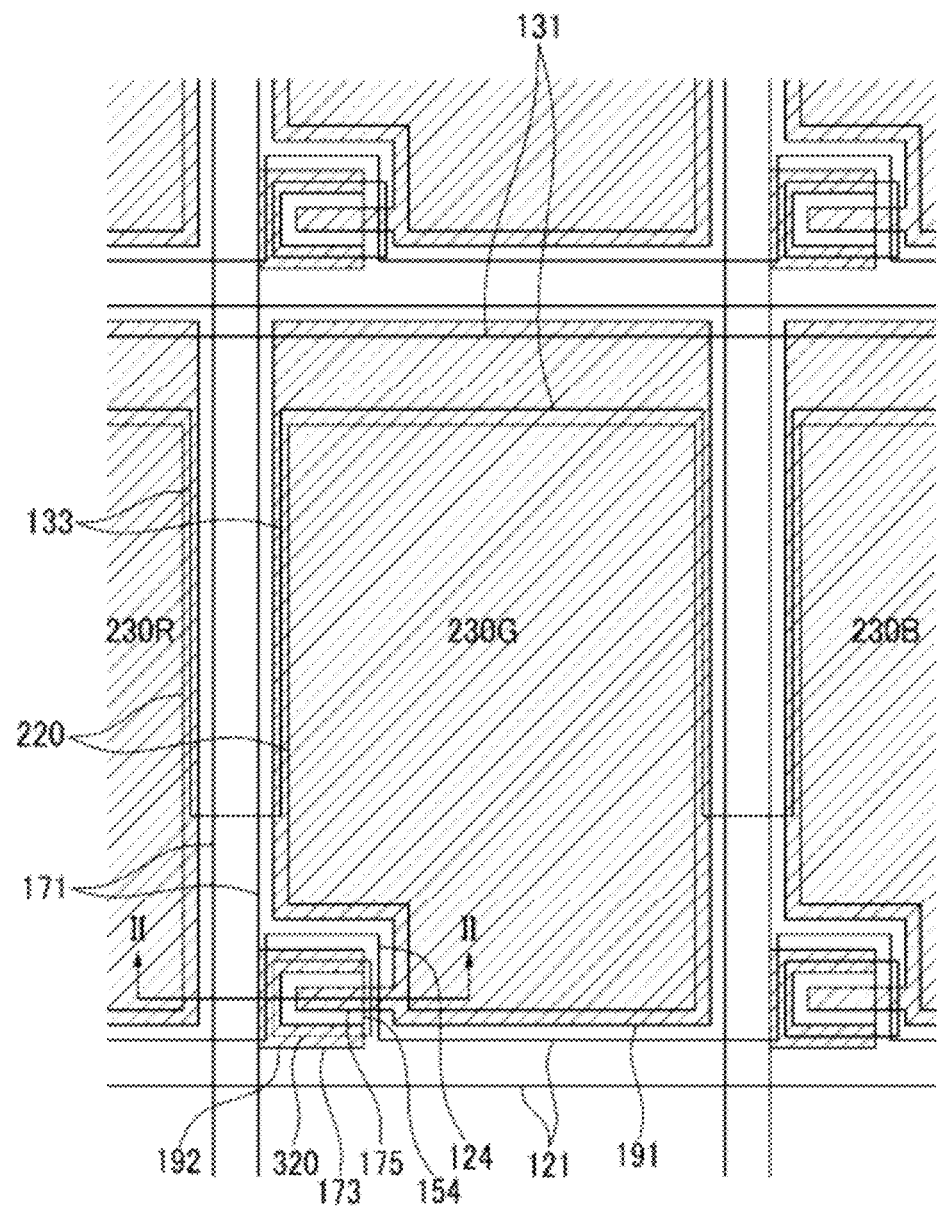
FIG. 1 is a layout view of a liquid crystal display according to an exemplary embodiment.

The present disclosure will be described more fully hereinafter with reference to the accompanying drawings, in which exemplary embodiments are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, or intervening elements may also be present. In contrast, when an element is referred to as being "directly on" another element, there are no intervening elements present.

Figure 2:
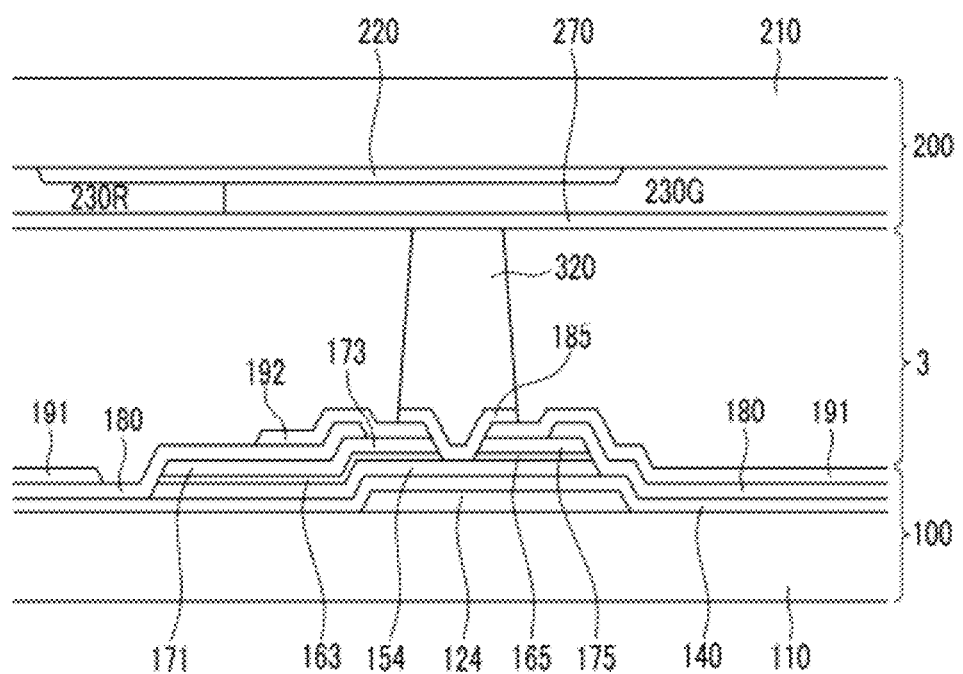
FIG. 2 is a cross-sectional view of the liquid crystal display shown in FIG. 1, taken along the line II-II.

A liquid crystal display according to an exemplary embodiment is described hereafter with reference to FIGS. 1 and 2.

FIG. 1 is a layout view of a liquid crystal display according to an exemplary embodiment and FIG. 2 is a cross-sectional view of the liquid crystal display shown in FIG. 1, taken along the line II-II.

Referring to FIGS. 1 and 2, a liquid crystal display according to an exemplary embodiment includes a thin film transistor array panel 100, a common electrode panel 200 opposite thereto, a liquid crystal layer 3 and a spacer 320 between two display panels 100 and 200.

The thin film transistor array panel 100 is described first.

In the thin film transistor array panel 100, a plurality of gate lines 121 and a plurality of storage electrode lines 131 are formed on a substrate 110. Substrate 110 is made of an insulating material, such as glass or plastic. A gate insulating layer 140, a plurality of semiconductors 154, a plurality of ohmic contacts 163 and 165, a plurality of data lines 171, and a plurality of drain electrodes 175 are sequentially formed on the thin film transistor array panel.

The gate lines 121 transmit gate signals and usually extend transversely. The gate lines 121 each include a plurality of gate electrodes 124 protruding upward from the gate line 121 in a plan layout view such as FIG. 1.

The storage electrode lines 131 receive a predetermined voltage, such as common voltage and extend substantially in parallel with the gate line 121, and each of which includes a storage electrode 133 that protrudes downward from the storage electrode 133 in a plan layout view such as FIG. 1, and overlap the data line 171. The storage electrode lines 131 each are positioned between two adjacent gate lines 121.

The gate lines 121 and the storage electrode lines 131 may be formed in a double layer structure composed of a lower layer containing, for example, aluminum-based metal, such as an aluminum alloy, and an upper layer containing, for example, molybdenum-based metal, such as molybdenum or a molybdenum alloy.

Further, the gate lines 121 and the storage electrode lines 131 may be formed in a single layer or a triple or more multilayer structure.

The data lines 171 transmit data signals and usually extend longitudinally across the gate lines 121. Each of the data lines 171 includes a plurality of source electrodes 173 extending outward from the data lines 171 toward the gate electrodes 124 (in a plan layout view such as FIG. 1). The drain electrodes 175 are separated from the data lines 171 and are opposite to the source electrodes 173, with the gate electrodes 124 therebetween.

The data lines 171 and the drain electrodes 175 may be formed in a triple layer structure composed of a lower layer made of, for example, pure molybdenum or molybdenum-based metal, including a molybdenum alloy, such as molybdenum nitride (MoN), molybdenum-Niobium (MoNb), molybdenum-vanadium (MoV), molybdenum-titanium (MoTi), and molybdenum-tungsten (MoW), an intermediate layer made of, for example, low-resistant aluminum or an aluminum alloy, such as aluminum-neodymium (AlNd), and an upper layer made of, for example, pure molybdenum, which has excellent contact property with ITO or IZO, or molybdenum-based metal, including a molybdenum alloy, such as molybdenum nitride (MoN), molybdenum-Niobium (MoNb), molybdenum-vanadium (MoV), molybdenum-titanium (MoTi), and molybdenum-tungsten (MoW).

Further, the data lines 171 and the drain electrodes 175 may be formed in a double layer structure composed of a lower layer made of, for example, titanium (Ti) or a titanium alloy and an upper layer made of, for example, copper (Cu) or a copper alloy.

The semiconductors 154 are on the gate electrodes 124 and the ohmic contacts 163 and 165 thereon are disposed between the semiconductors 154 and the data lines 171 and drain electrodes 175, respectively, thereby reducing contact resistivity between them.

One gate electrode 124, one source electrode, 173 and one drain electrode 175 constitute a thin film transistor (TFT) together with the semiconductor 154. The channel of the thin film transistor is formed at the semiconductor 154 between the source electrode 173 and the drain electrode 175.

A passivation layer 180 is formed on the gate insulating layer 140 and the data lines 171. The passivation layer 180 is not formed on portions of the source electrodes 173 and the drain electrodes 175, so that those portions of the source electrodes 173 and the drain electrodes 175 are exposed.

First pixel electrodes 191 are formed on the passivation layer 180 and the drain electrodes 175. Second pixel electrodes 192 are formed on the passivation layer 180 and the source electrodes 173. The first and second pixel electrodes 191 and 192 may be made of a transparent conductive material, such as, for example, ITO (indium tin oxide) or IZO (indium zinc oxide), or reflective metal, such as, for example, aluminum or a silver alloy. The first pixel electrodes 191 contact to the drain electrode 175 and the second pixel electrodes 192 contact to the source electrodes 173. The first pixel electrodes 191 and the second pixel electrodes 192 are separated.

A buffer layer 185 is formed between the source electrode 173 and the drain electrode 175 to protect the semiconductor 154. The spacer 320 is formed on the buffer layer 185. The thickness of the liquid crystal layer 3 may depend on the spacer 320.

Next, the common electrode panel 200 is described.

The common electrode panel 200 is opposite to the thin film transistor array panel 100 and includes a substrate 210, a plurality of light blocking member 220, which are referred to as black matrixes, formed on the substrate 210. Color filters 230R, 230G, and 230B are formed on the substrate 210 and the light blocking members 220. A common electrode 270 is formed on the color filters 230R, 230G, and 230B. However, the common electrode 270 may be formed on the thin film transistor array panel 100.

Further, the liquid crystal layer 3 is disposed between the common electrode panel 200 and the thin film transistor array panel 100.

A method of manufacturing the liquid crystal display shown in FIG. 1 and FIG. 2 is described hereafter with reference to FIG. 3 to FIG. 8, together with FIG. 1 and FIG. 2.

FIG. 3 to FIG. 8 are cross-sectional views sequentially illustrating a method of manufacturing the liquid crystal display shown in FIG. 1.

Figure 3:
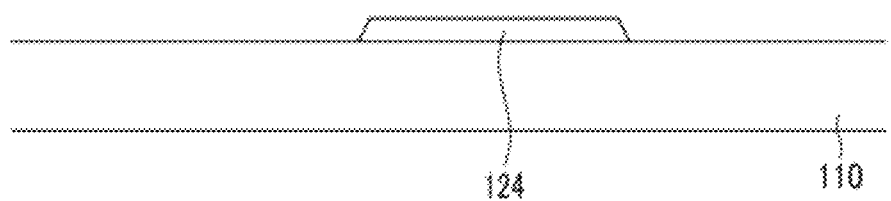
FIG. 3 to FIG. 8 are cross-sectional views sequentially illustrating a method of the liquid crystal display shown in FIG. 1.

As shown in FIG. 3, the gate line 121 including the gate electrode 124 is formed first on the insulation substrate 110.

Figure 4:
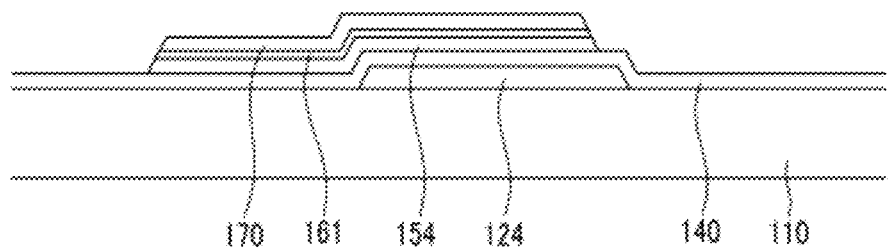

Thereafter, as shown in FIG. 4, the gate insulating layer 140 is formed on the entire surface of the insulation substrate 110 including the gate line 121. The semiconductor 154, amorphous silicon layer 161 doped with impurities, and the data metal layer 170 are sequentially stacked on the entire surface of the gate insulating layer 140. Then, the semiconductor 154, amorphous silicon layer 161 doped with impurities, and the data metal layer 170 are wet-etched by one mask.

Figure 5:
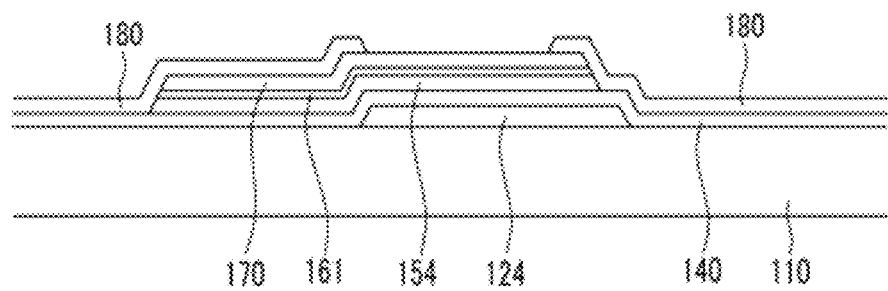

In this process, the semiconductor 154 is prevented from protruding outside the data line 171 and the drain electrode 175 when the data line 171 and the drain electrode 175 are formed by etching the data metal layer 170. This is accomplished by performing an etch back process before etching the semiconductor 154 such that the ends of the data metal layer 170 and the semiconductor 154 are aligned Thereafter, as shown in FIG. 5, the passivation layer 180 is formed on the gate insulating layer 140 and the data metal layer 170. Patterning is then performed such that the data metal layer 170 corresponding to the channel of the thin film transistor is exposed.

Figure 6:
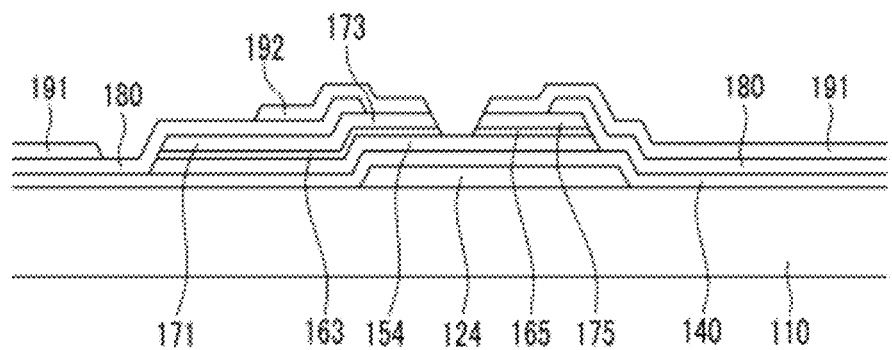

Thereafter, as shown in FIG. 6, the transparent conductive layer, such as ITO or IZO, is stacked on the passivation layer 180 and the data metal layer 170. Then, the first and second pixel electrodes 191 and 192 are formed by wet-etching the transparent conductive layer. Further, the source electrode 173, the drain electrode 175, the ohmic contact layer 163 and 165, and the channel of the thin film transistor are formed by etching the data metal layer 170 and the amorphous silicon layer 160, using the first and second pixel electrodes 191 and 192 as a mask. In this process, the same etching solution is used to etch the transparent conductive layer, the data metal layer 170, and the amorphous silicon layer 160.

In this configuration, the drain electrode 175 is in contact with the first pixel electrode 191 and the source electrode 173 is in contact with the second pixel electrode 192 while the first pixel electrode 191 and the second pixel electrode 192 are separated.

As described above, because the drain electrode 175 and the first pixel electrode 191 are in direct contact, a contact hole for contacting the first pixel electrode 191 with the drain electrode 175 is not necessary.

Figure 7:
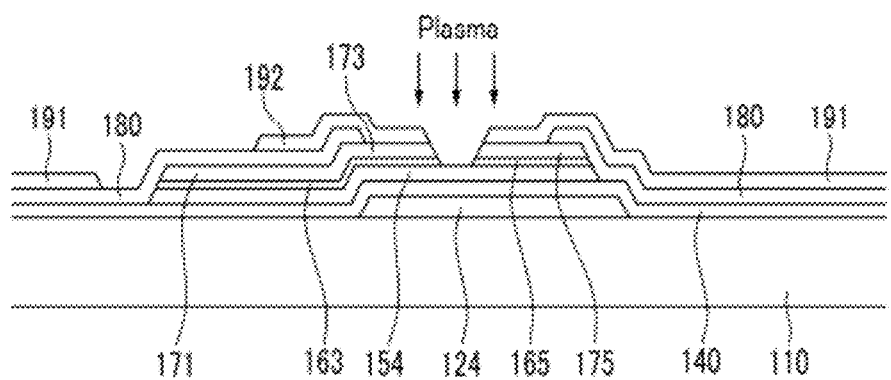

Thereafter, as shown in FIG. 7, a plasma treatment process is applied to the first and second pixel electrodes 191 and 192.

The plasma treatment process performs plasma treatment, using a gas mixture of, for example, hydrogen gas $H_2$ and nitrogen gas $N_2$, under a 250° C. condition In this process, the mixing ratio of the hydrogen gas $H_2$ and the nitrogen gas $N_2$ may be 1:1 or more. For example, a gas mixture having a 1:3 mixing ratio of the hydrogen gas $H_2$ and the nitrogen gas $N_2$ gas may be used. It is possible to prevent haze in the first and second pixel electrodes 191 and 192 by performing the plasma treatment using the gas mixture of the hydrogen gas $H_2$ and the nitrogen gas $N_2$.

Further, when semiconductor 154 is an oxide semiconductor, such as, for example, zinc oxide (ZnO), indium zinc oxide (InZnO), indium gallium oxide (InGaO), indium tin oxide (InSnO), zinc tin oxide (ZnSnO), gallium tin oxide (GaSnO), gallium zinc oxide (GaZnO), or gallium indium zinc oxide (GaInZnO), haze may be generated at the channel of the thin film transistor. It is possible, however, to prevent the haze by performing the plasma treatment.

Further, when the data line 171 and the drain electrode 175 contain copper, it is possible to perform the plasma treatment using a gas mixture of an ammonia gas $NH_3$ and a nitrogen gas $N_2$.

Figure 8:
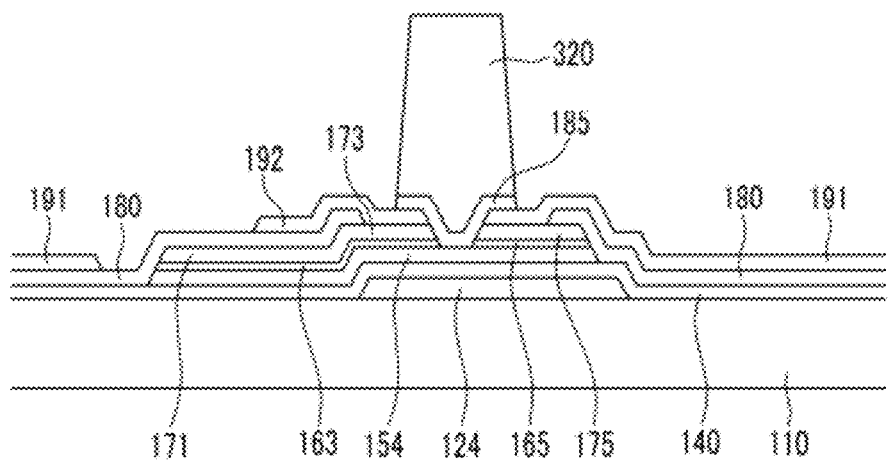

Thereafter, as shown in FIG. 8, the buffer layer 185 is formed on the channel to protect the channel of the thin film transistor.

The buffer layer 185 is formed by forming a nitrified silicon film on the first and second pixel electrodes 191 and 192 and the channel of the thin film transistor under a 220 to 280° C. condition, forming the spacer 320 on the nitrified film corresponding to the channel of the thin film transistor, and then etching the nitrified silicon film by using the spacer 320 as a mask.

Thereafter, as shown in FIGS. 1 and 2, common electrode panel 200, which is formed by sequentially forming the light blocking member 220, the color filters 230R, 230G, and 230B, and the common electrode 270 on the insulation substrate 210, is formed. Then, the thin film transistor array panel 100 and the common electrode panel 200 are assembled.

Next, a liquid crystal display according to another exemplary embodiment is described with reference to FIG. 9 and FIG. 10.

Figure 9:
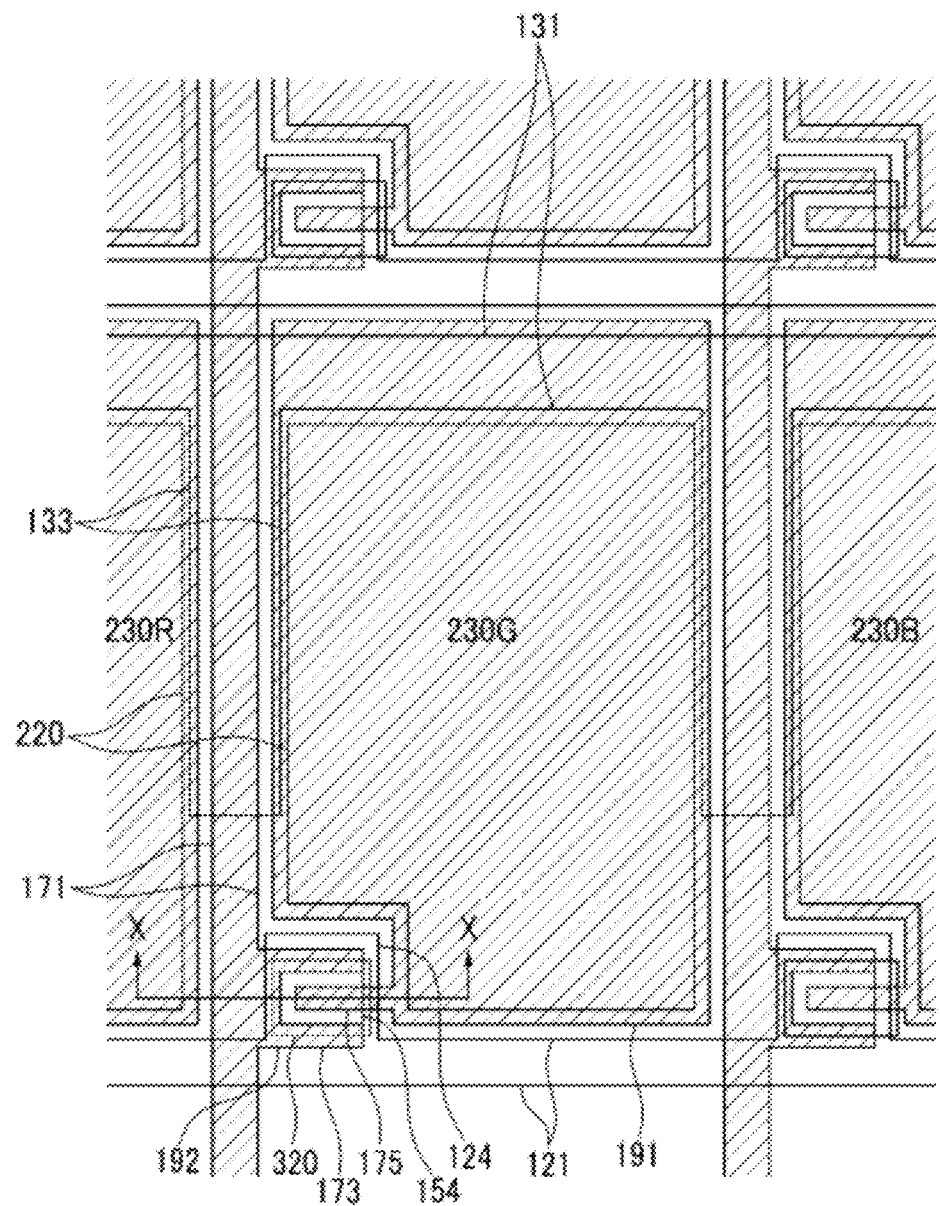
FIG. 9 is a layout view of a liquid crystal display according to another exemplary embodiment.
Figure 10:
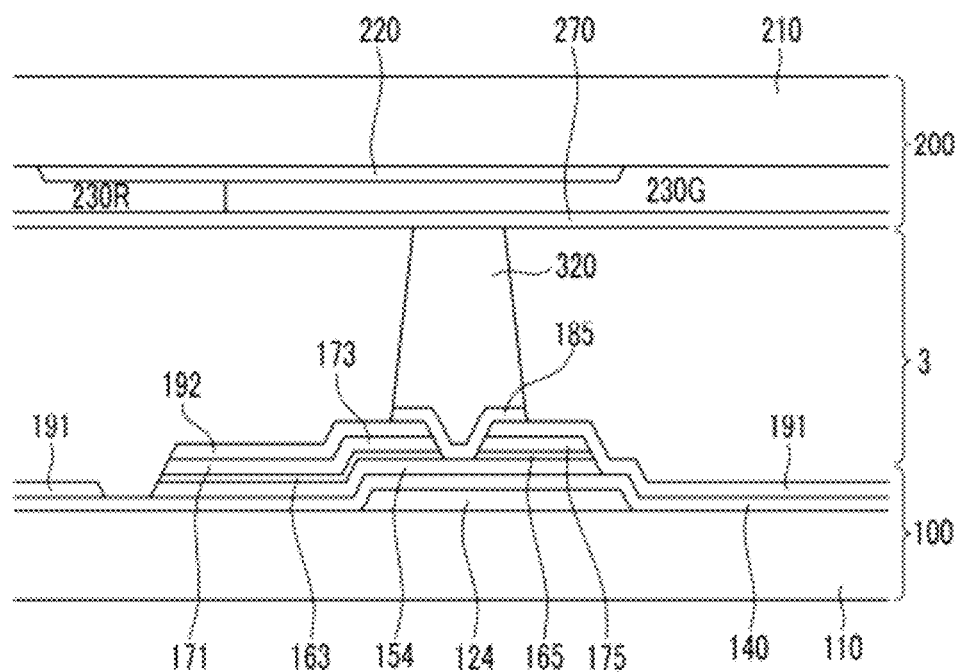
FIG. 10 is a cross-sectional view of the liquid crystal display shown in FIG. 9, taken along the line X-X.

FIG. 9 is a layout view of a liquid crystal display according to another exemplary embodiment and FIG. 10 is a cross-sectional view of the liquid crystal display shown in FIG. 9, taken along the line X-X.

As shown in FIG. 9 and FIG. 10, the structure of the liquid crystal display according to the exemplary embodiment shown in FIG. 9 and FIG. 10 includes a thin film transistor array panel 100, a common electrode 200 opposite thereto, and a liquid crystal layer 3 and a spacer 320 between two display panels 100 and 200, the same as the exemplary embodiment shown in FIG. 1 and FIG. 2. However, unlike the liquid crystal display according to the exemplary embodiment shown in FIG. 1 and FIG. 2, in the liquid crystal display according to the exemplary embodiment shown in FIG. 9 and FIG. 10, a passivation layer (such as passivation layer 180 in FIGS. 1 and 2) is not formed on data lines and a gate insulating layer of the thin film transistor array panel.

In the thin film transistor array panel 100, a plurality of gate lines 121 and a plurality of storage electrode lines 131 are formed on a substrate 110. The substrate 110 is made of an insulating material, such as glass or plastic. A gate insulating layer 140, a plurality of semiconductors 154, a plurality of ohmic contacts 163 and 165, a plurality of data lines 171 and a plurality of drain electrodes 175 are sequentially formed on the thin film transistor array panel.

The gate lines 121 and the storage electrode lines 131 may be formed in a double layer structure composed of a lower layer containing, for example, aluminum-based metal, such as an aluminum alloy, and an upper layer containing, for example, molybdenum (Mo) or molybdenum-based metal, such as a molybdenum alloy.

Further, the gate lines 121 and the storage electrode lines 131 may be formed in a single layer or a triple or more multilayer structure.

The data lines 171 include a plurality of source electrode 173 extending outward from the data lines 171 toward the gate electrodes 124 (in a plan layout view such as FIG. 1). The data lines 171 and the drain electrode 175 may be formed in a triple layer structure composed of a lower layer made of, for example, pure molybdenum or molybdenum-based metal, including a molybdenum alloy, such as molybdenum nitride (MoN), molybdenum-Niobium (MoNb), molybdenum-vanadium (MoV), molybdenum-titanium (MoTi), and molybdenum-tungsten (MoW), an intermediate layer made of, for example, low-resistant aluminum or an aluminum alloy, such as aluminum-neodymium (AlNd), and an upper layer made of, for example, pure molybdenum, which has excellent contact property with ITO or IZO, or molybdenum-based metal, including a molybdenum alloy, such as or molybdenum nitride (MoN) molybdenum-Niobium (MoNb), molybdenum-vanadium (MoV), molybdenum-titanium (MoTi), and molybdenum-tungsten (MoW).

Further, the data lines 171 and the drain electrodes 175 may be formed in a double layer structure composed of a lower layer made of, for example, titanium (Ti) or a titanium alloy and an upper layer made of, for example, copper (Cu) or a copper alloy.

One gate electrode 124, one source electrode, 173 and one drain electrode 175 constitute a thin film transistor (TFT) together with the semiconductor 154. The channel of the thin film transistor is formed at the semiconductor 154 between the source electrode 173 and the drain electrode 175.

First pixel electrodes 191 are formed on the gate insulating layer 140 and the drain electrodes 175. Second pixel electrodes 192 are formed on the gate insulating layer 140 and the data lines 171. The first pixel electrodes 191 contact to the drain electrodes 175 and the second pixel electrodes 192 contact to the data line 171. The first pixel electrodes 191 and the second pixel electrodes 192 are separated.

A buffer layer 185 is formed between the source electrode 173 and the drain electrode 175 to protect the semiconductor 154. The spacer 320 is formed on the buffer layer 185.

The common electrode panel 200, which is the same as the liquid crystal display according to the exemplary embodiment of FIG. 1 and FIG. 2, includes a substrate 210, a plurality of light blocking member 220 formed on the substrate 210, color filters 230R, 230G, and 230B formed on the substrate 210 and the light blocking members 220, and a common electrode 270 formed on the color filters 230R, 230G, and 230B. However, the common electrode 270 may be formed on the thin film transistor array panel 100.

Further, the liquid crystal layer 3 is disposed between the common electrode panel 200 and the thin film transistor array panel 100.

A method of manufacturing the liquid crystal display shown in FIG. 9 and FIG. 10 is described hereafter with reference to FIG. 11 to FIG. 14, together with FIG. 9 and FIG. 10. FIG. 11 to FIG. 14 are cross-sectional views sequentially illustrating a method of manufacturing the liquid crystal display shown in FIG. 9 and FIG. 10.

Figure 11:
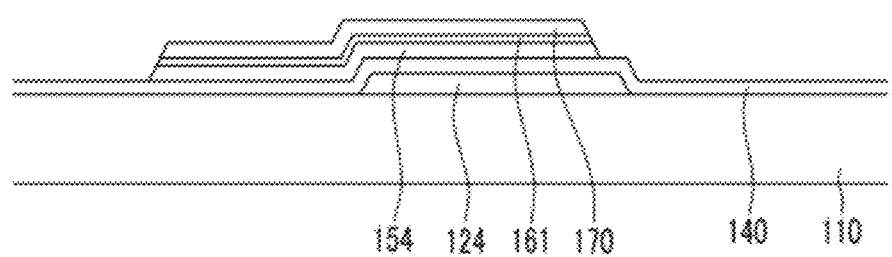
FIG. 11 to FIG. 14 are cross-sectional views sequentially illustrating a method of manufacturing the liquid crystal display shown in FIG. 9.

First, as shown in FIG. 11, substantially the same method of manufacturing the liquid crystal display according to the exemplary embodiment shown in FIG. 1 and FIG. 2 may be used. The gate line 121 including the gate electrode 124 is formed on the insulation substrate 110. Then, the gate insulating layer 140 is formed on the entire surface of the insulation substrate 110 including the gate line 121. Next, the semiconductor 154, amorphous silicon layer 161 doped with impurities, and the data metal layer 170 are sequentially stacked on the entire surface of the gate insulating layer 140, and the semiconductor 154, amorphous silicon layer 161 doped with impurities. The data metal layer 170 are wet-etched by one mask. The ends of the data metal layer 170 and the semiconductor 154 are aligned by performing an etch back process before etching the semiconductor 154.

Figure 12:
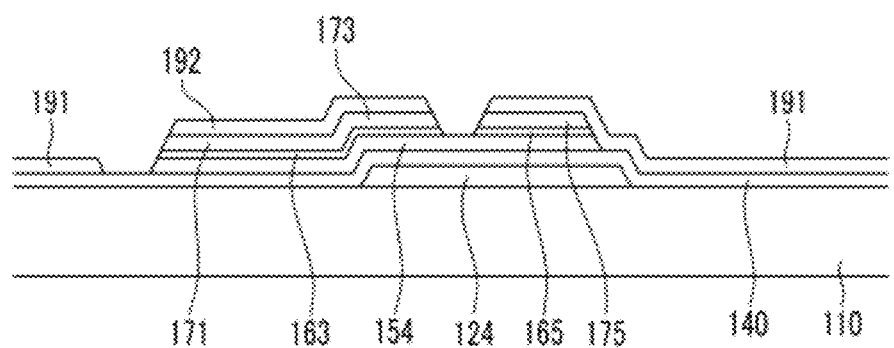

Thereafter, as shown in FIG. 12, the transparent conductive layer, such as ITO or IZO, is stacked on the gate insulating layer 140 and the data metal layer 170. Then, the first and second pixel electrodes 191 and 192 are formed by wet-etching the transparent conductive layer. Further, the source electrode 173, the drain electrode 175, the ohmic contact layer 163 and 165, and the channel of the thin film transistor are formed by etching the data metal layer 170 and the amorphous silicon layer 160, using the first and second pixel electrodes 191 and 192 as a mask. In this process, the same etching solution is used to etch the transparent conductive layer, the data metal layer 170, and the amorphous silicon layer 160.

In this configuration, the drain electrode 175 is in contact with the first pixel electrode 191 and the data line 171 is in contact with the second pixel electrode 192 while the first pixel electrode 191 and the second pixel electrode 192 are separated.

As described above, because the drain electrode 175 and the first pixel electrode 191 are in direct contact, a contact hole for contacting the first pixel electrode 191 with the drain electrode 175 is not necessary.

Figure 13:
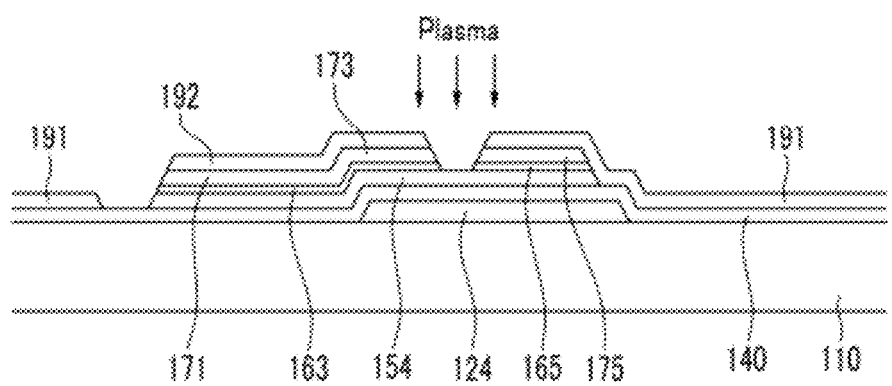

Thereafter, as shown in FIG. 13, a plasma treatment process is applied to the first and second pixel electrodes 191 and 192.

The plasma treatment process performs plasma treatment, using a gas mixture of, for example, hydrogen gas $H_2$ and nitrogen gas $N_2$, under a 250° C. condition. In this process, the mixing ratio of the hydrogen gas $H_2$ and the nitrogen gas $N_2$ may be 1:1 or more. For example, a gas mixture having a 1:3 mixing ratio of the hydrogen gas $H_2$ and the nitrogen gas $N_2$ gas may be used. As described above, it is possible to prevent haze in the first and second pixel electrodes 191 and 192 by performing the plasma treatment, using the gas mixture of the hydrogen gas $H_2$ and the nitrogen gas $N_2$.

Further, when semiconductor 154 is an oxide semiconductor, such as, for example, zinc oxide (ZnO), indium zinc oxide (InZnO), indium gallium oxide (InGaO), indium tin oxide (InSnO), zinc tin oxide (ZnSnO), gallium tin oxide (GaSnO), gallium zinc oxide (GaZnO), or gallium indium zinc oxide (GaInZnO), haze may be generated at the channel of the thin film transistor. It is possible, however, to prevent the haze by performing the plasma treatment.

Further, when the data line 171 and the drain electrode 175 contain copper, it is possible to perform the plasma treatment, using a gas mixture of an ammonia gas $NH_3$ and nitrogen gas $N_2$.

Figure 14:
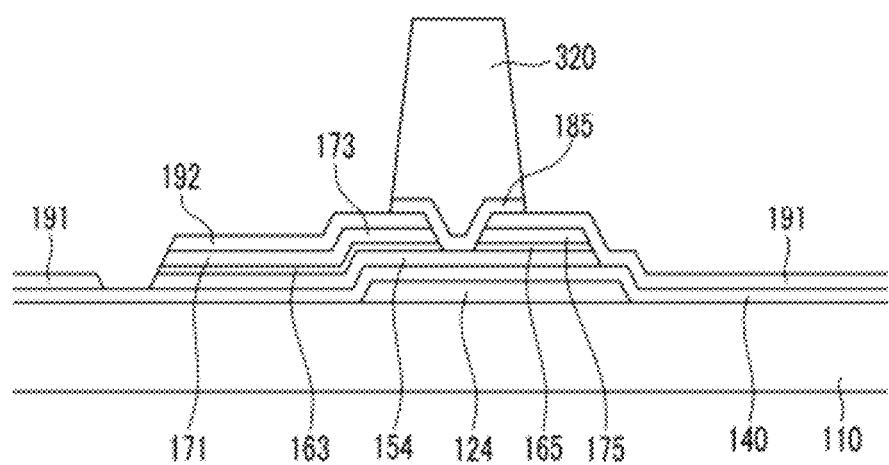

Thereafter, as shown in FIG. 14, the buffer layer 185 is formed on the channel to protect the channel of the thin film transistor.

The buffer layer 185 is formed by forming a nitrified silicon film on the pixel electrode 191 and the channel of the thin film transistor under a 220 to 280° C. condition, forming the spacer 320 on the nitrified film corresponding to the channel of the thin film transistor, and then etching the nitrified silicon film by using the spacer 320 as a mask.

Thereafter, as shown in FIGS. 9 and 10, common electrode panel 200, which is formed by sequentially forming the light blocking member 220, the color filters 230R, 230G, and 230B, and the common electrode 270 on the insulation substrate 210, is formed. Then, the thin film transistor array panel 100 and the common electrode panel 200 are assembled.

Hereafter, generation of haze when performing plasma processing using different combinations of gases is described with reference to FIG. 15A to FIG. 15D.

FIG. 15A to FIG. 15D are electron-microscopic pictures of the results of a plasma process performed on an IZO.

Figure 15A:
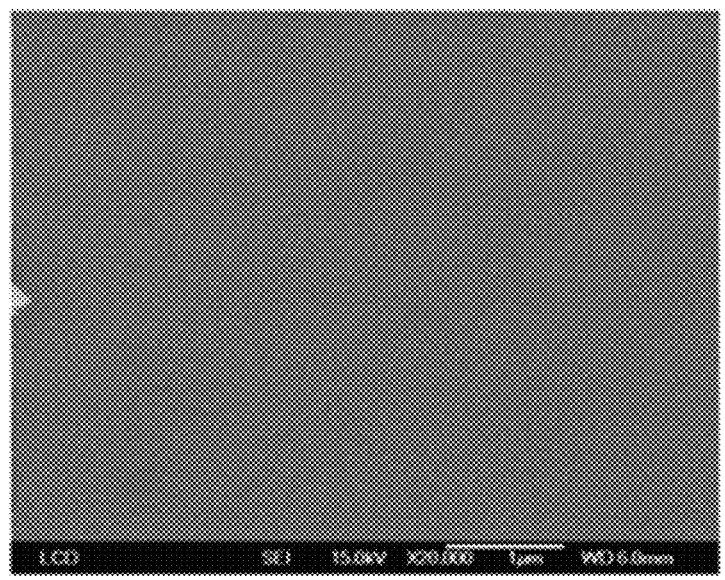
FIGS. 15A, 15B, 15C and FIG. 15D are electron-microscopic pictures of the results of a plasma process performed on an IZO.
Figure 15B:
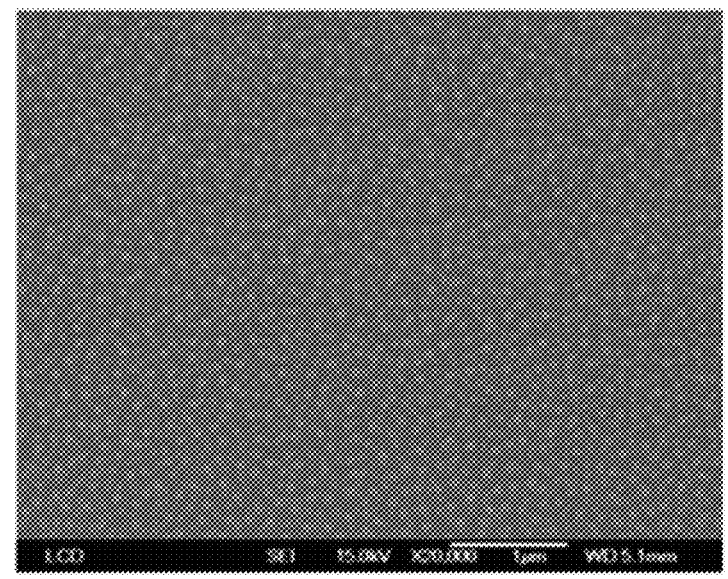
Figure 15C:
Figure 15D:
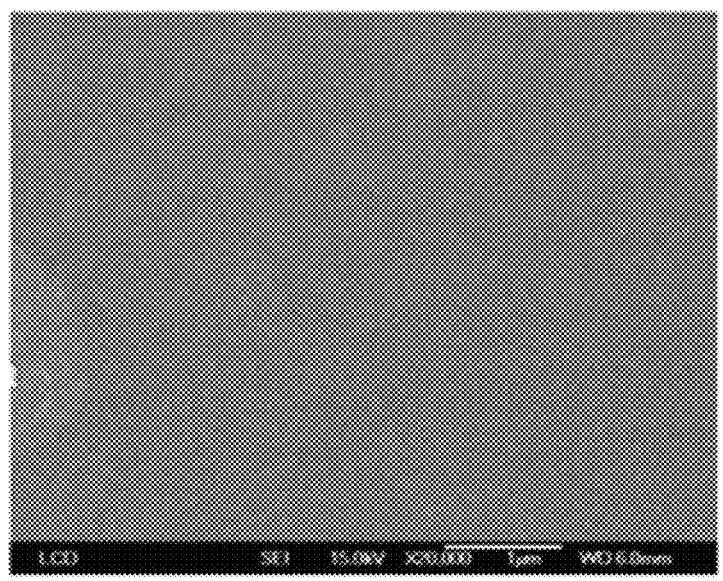

FIG. 15A shows the results of a plasma process performed by means of a hydrogen gas on the IZO of 900 Å, FIG. 15B shows the results of a plasma process performed by means of a nitrogen gas on the IZO of 900 Å, FIG. 15C shows the results of a plasma process performed by means of an ammonia gas on the IZO of 900 Å, and FIG. 15D shows the results of a plasma process performed by means of a gas mixture of a nitrogen gas and a hydrogen gas on the IZO of 900 Å.

As shown in FIG. 15A to FIG. 15D, haze was not generated when the plasma process was performed by means of the gas mixture of a hydrogen gas and a nitrogen gas, shown in FIG. 15D, while haze was partially or entirely generated in the other cases.

That is, it can be seen that haze is not generated when a plasma process is performed using a gas mixture of nitrogen gas and hydrogen gas.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. For example, although the exemplary embodiments are in connection with a liquid crystal display, the present invention may be applied to a variety of display devices including a spacer.

What is claimed is:

1. A method of manufacturing a liquid crystal display, comprising:
    forming a gate line including a gate electrode on a substrate;
    forming a gate insulating layer on the gate line;
    sequentially forming a semiconductor layer, an amorphous silicon layer, and a data metal layer on the entire surface of the gate insulating layer;
    aligning the edges of the semiconductor layer and the data metal layer by etching the semiconductor layer, the amorphous silicon layer, and the data metal layer;
    forming a transparent conductive layer on the gate insulating layer and the data metal layer;
    forming a first pixel electrode and a second pixel electrode by patterning the transparent conductive layer;
    forming a data line including a source electrode, a drain electrode, and an ohmic contact layer by etching the data metal layer and the amorphous silicon layer, using the first pixel electrode and the second pixel electrode as a mask, and exposing the semiconductor between the source electrode and the drain electrode;
    applying a plasma process to the exposed semiconductor;
    forming a nitrified silicon film on the first pixel electrode, the second pixel electrode, and the exposed semiconductor,
    forming a spacer on the nitrified silicon film corresponding to the exposed semiconductor, and
    forming a buffer layer by etching the nitrified silicon film, using the spacer as a mask,
    wherein the first pixel electrode is in contact with the drain electrode and the second pixel electrode is in contact with the source electrode.

2. The method of claim 1, wherein the plasma process is performed by using a gas mixture of a hydrogen gas and a nitrogen gas, under a 250° C. condition.

3. The method of claim 2, wherein the mixing ratio of the hydrogen gas and the nitrogen gas is 1:1 or more.

4. The method of claim 3, wherein the mixing ratio of the hydrogen gas and the nitrogen gas is 1:3.

5. The method of claim 4, further comprising:
    forming a passivation layer between the gate insulating layer and the data line, and between the first pixel electrode and the second pixel electrode,
    wherein the passivation layer exposes the source electrode and the drain electrode.

6. The method of claim 5, wherein the aligning of the ends of the semiconductor layer and the data metal layer further includes performing an etch back process before etching the semiconductor layer, after etching the amorphous silicon layer and the data metal layer.

7. The method of claim 6, wherein the etching solution for etching the transparent conductive layer and the etching solution for etching the data metal layer and the amorphous silicon layer are the same.

8. The method of claim 7, wherein the data line and the drain electrode comprise a lower layer, the lower layer including at least one of molybdenum, molybdenum-based metal, molybdenum nitride, molybdenum-niobium, molybdenum-vanadium, molybdenum-titanium, and molybdenum-tungsten, an intermediate layer, the intermediate layer including at least one of aluminum, aluminum-based metal, and aluminum-neodymium, and an upper layer, the upper layer including at least one of molybdenum, molybdenum-based metal, molybdenum nitride, molybdenum-niobium, molybdenum-vanadium, molybdenum-titanium, and molybdenum-tungsten.

9. The method of claim 7, wherein the data line and the drain electrode comprise a lower layer including at least one of titanium and a titanium alloy, and an upper layer including at least one of copper and a copper alloy.

10. The method of claim 1, wherein the first pixel electrode is in contact with the gate insulating layer, and
    the second pixel electrode extends above the data line, in contact with the data line.

11. The method of claim 1, further comprising:
   forming a passivation layer between the gate insulating layer and the data line and between the first pixel electrode and the second pixel electrode,
   wherein the passivation layer exposes the source electrode and the drain electrode.

12. The method of claim 11, wherein the aligning of the edges of the semiconductor layer and the data metal layer further includes performing an etch back process before etching the semiconductor layer, after etching the amorphous silicon layer and the data metal layer.

13. The method of claim 12, wherein the etching solution for etching the transparent conductive layer and the etching solution for etching the data metal layer and the amorphous silicon layer are the same.

14. The method of claim 1, wherein the aligning of the ends of the semiconductor layer and the data metal layer further includes performing an etch back process before etching the semiconductor layer, after etching the amorphous silicon layer and the data metal layer.

15. The method of claim 14, wherein the etching solution for etching the transparent conductive layer and the etching solution for etching the data metal layer and the amorphous silicon layer are the same.

16. The method of claim 1, wherein the semiconductor layer is an oxide semiconductor.

\* \* \* \* \*